United States Patent [19]
Huckstepp

[11] Patent Number: 5,305,327
[45] Date of Patent: Apr. 19, 1994

[54] TESTING RANDOM ACCESS MEMORIES

[75] Inventor: Stephen A. Huckstepp, Basingstoke, England

[73] Assignee: Sony Corporation, Tokyo, Japan

[21] Appl. No.: 659,676

[22] Filed: Feb. 25, 1991

[30] Foreign Application Priority Data

Mar. 28, 1990 [GB] United Kingdom ............... 9006915

[51] Int. Cl.$^5$ ............................................ G11C 29/00
[52] U.S. Cl. ................................................ 371/21.3
[58] Field of Search ..................... 371/22.1, 21.1, 21.2, 371/22.5, 21.3

[56] References Cited

PUBLICATIONS

Little, R. et al., "Built-In-Test-Requirements, Issues and Architectures", *TI Technical Journal*, Jul.-Aug. 1988, pp. 111-122.
Daniel, W. et al., "YHSIC Testability: An IC- to System-Level Implementation", *TI Technical Journal*, Jul.-Aug. 1988, pp. 123-132.
Budde, W., "Modular Testprocessor for VLSI Chips and High-Density PC Boards", *IEEE Transactions on Computer-Aided Design*, vol. 7, No. 10, pp. 1118-1124.
Dekker, R. et al., "Realistic Built-In Self-Test for Static RAMs", *IEEE Design & Test of Computers*, Feb. 1989, pp. 26-34.
IBM Technical Disclosure Bulletin, vol. 27, No. 4A, Sep. 1984, New York US pp. 1984-1987; D. C. Haigh: Data Patterns for Bus or Ram Checkout.
Proceedings of the International Test Conference, Sep. 1-3, 1987, pp. 759-764, IEEE, New York, US; E. F. Sarkany et al.; Minimal Set of Patterns to Test Ram Components p. 763, right column, line 1- p. 765, left column, line 42.
Digest of Papers of the 1980 Test Conference, Nov. 11-13, 1980, pp. 131-136, IEEE, New York, US; F. D. Patch et al.: Evaluation of Array Tests.

*Primary Examiner*—Stephen M. Baker
*Attorney, Agent, or Firm*—William S. Frommer; Alvin Sinderbrand

[57] ABSTRACT

A method for testing data lines of a random access memory in which two sets of test words are generated such that each test word has a number of bits equal to the number (D) of data lines. The first set has n test words where n is determined by the expression $2^n \geq D > 2^{n-1}$. The test words in the first set have respective designations $S=0$ to $n-1$. The bits of each test word are arranged in groups where each group has $2^S$ number of bits. All of the bits in an individual group have the same binary level and the adjacent groups have bits of the opposite binary level. The second set also has n test words with respective designations $S=0$ to $n-1$ and are respectively similar to the test words in the first set except that the binary level of each bit in each test word in the second set is opposite to the binary level of the respective bit of the corresponding test word in the first set. One of the test words from either set is written into each of the address locations of the random access memory. The address locations are then read and it is determined whether each of the read test words is the same as the test word which was written. The above process is repeated until all of the test words in the first set are written and read and only one of the test words in the second set is written and read.

9 Claims, 2 Drawing Sheets

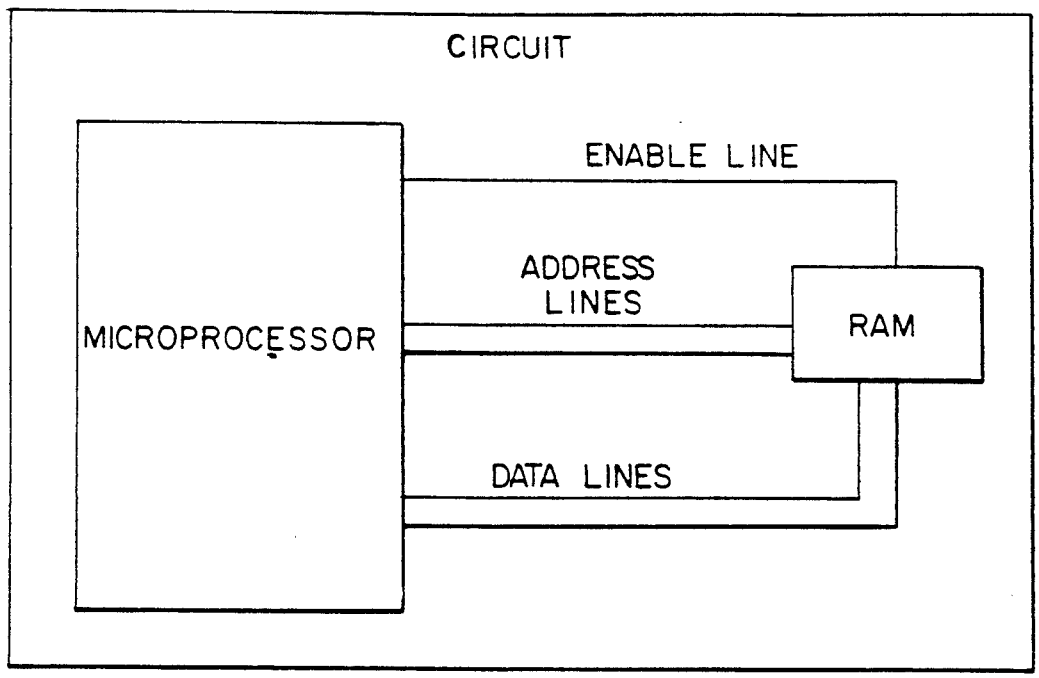
FIG. 3
FIG. 4
PRIOR ART
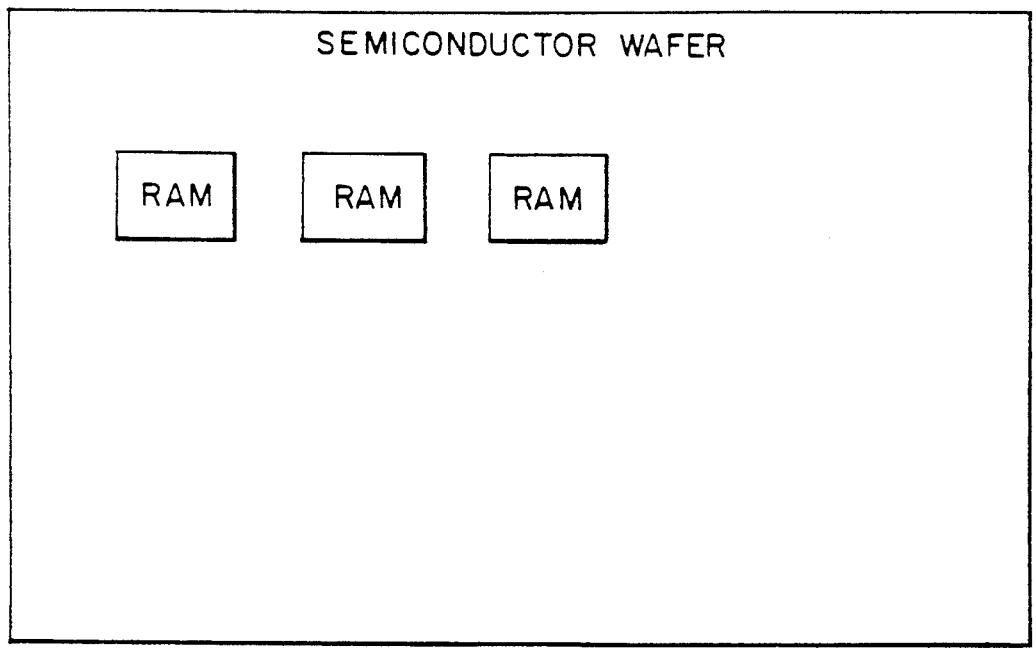

TESTING RANDOM ACCESS MEMORIES

BACKGROUND OF THE INVENTION

1. Field of the Invention

This invention relates to the testing of random access memories (RAMs), and, more particularly, is concerned with testing data lines of RAMs.

2. Description of the Prior Art

It is known, in microprocessor circuits including RAMs, to test the RAMs to check that they are operating correctly. Such tests may be administered as a post-assembly functionality check after a circuit board incorporating a RAM has been manufactured, or as a diagnostic check each time that the circuit is powered up.

As shown in FIG. 1, a typical RAM comprises data lines for connection to a data bus of a circuit (not shown) of which the RAM forms part or is to form part, address lines for connection to an address bus of the circuit, and an enable line for connection to the circuit for activation of the RAM.

FIG. 2 is a memory map of a typical RAM. The RAM has a plurality of address locations each having the capacity to store a word or byte comprising a number of bits equal to the number of data lines. By way of example, the memory map shown in FIG. 2 represents a RAM which has 64 address locations (numbered 0 to 63) each capable of storing an 8-bit word or byte. In this example, as shown in FIG. 1, the RAM has eight data lines. Also, since six bits are necessary to address 64 ($=2^6$) address locations, the RAM has six address lines.

To comprehensively check the RAM, each data line, each address line and the enable line has to be tested. These tests are required to look for open circuits or short circuits to supply voltage or ground and open circuits or short circuits to any other of the above-mentioned lines.

Known RAM enable line and address line tests comprise filling each of the address locations with a test word, then reading the test words from each address location and checking that it is the same as the test words as written to the address location. The process is then repeated with another test word.

Testing of the data lines, with which the present invention is concerned, requires: (a) writing a test word into all of the address locations of the RAM; (b) reading the est word from all of the address locations of the RAM and checking that the test word as read from each of the address locations is the same as the test word written in; and (c) repeating steps (a) and (b) for a plurality of different test words.

Selection of the test words represents a problem. Clearly, the data lines could be tested with a high confidence of detecting all faults if all possible test words were used (though this involves the disadvantage of having to generate all of the many possible test words). In such a case, pursuing the above example of a RAM having 64 8-bit address locations, there are 256 ($=2^8$) possible test words and each of these would have to be written to all address locations and then read from each address location and checked. If, for example, each of the 16,384 ($=256 \times 64$) reading and checking operations took (say) about 5 microseconds, the total test time would be about 82 milliseconds. In most cases, such a total testing time would be acceptable. However, RAM is often used in much larger amounts. A typical modern microcomputer has at least about 512K of RAM, whereby the total testing time (again at a rate of 5 microseconds per operation) would be nearly eleven minutes and would therefore be prohibitively long. This would be even more clearly so in the case of a RAM having (as is often the case) more than 512K 8-bit address locations.

OBJECTS AND SUMMARY OF THE INVENTION

Accordingly, it is an object of the present invention to provide a method of testing the data lines of a RAM which avoids the above-mentioned disadvantages of the prior art.

More specifically, it is an object of the invention to enable the data lines of a RAM to be tested with a high degree of confidence, and yet using a restricted number of test words whereby redundant testing is minimized.

The invention provides a method of testing data lines of a RAM, the method comprising:

(a) writing a test word into all of the address locations of the RAM;

(b) reading the test word from all of the address locations of the RAM and checking that the test word as read from each of the address locations is the same as the test word written in; and (c) repeating steps (a) and (b) with other test words.

According to the invention, the test words are defined as follows:

(1) for each value of s from 0 to $(n-1)$, where D is the number of data lines and $2^n > D > 2^{n-1}$, there is a first test word which (subject to truncation if necessary to limit the number of bits in the word to D) comprises groups of $2^s$ bits, wherein the bits of each group are of the same binary level and the binary level alternates between groups; and (2) for at least one of the values of s from 0 to $(n-1)$, there is a second test word which is the same as the first test word for the same value of s except that the corresponding bits of the two words are of opposite binary level.

In an embodiment of the invention described below there may be a second test word for each of the values of s from 0 to $(n-1)$. However, as explained below, this introduced some redundancy and it is in fact sufficient for there to be a second test word for less than all, but at least one, of the values of s from 0 to $(n-1)$.

As explained in more detail below, the above-defined test words enable reliable detection of all preemptable/foreseeable faults. The above-defined test words are a sub-set of all possible test words, whereby the need to generate all possible test words is avoided. Further, as may be of crucial importance in many applications at least when the RAM is of reasonably large capacity, the testing time can be reduced as compared to the case in which all possible test words are employed, in that a great amount of redundant checking is eliminated.

For instance, consider the case in which, as in the above example, there are eight data lines, that is D=8. Since D=8, n will be equal to 3. The test words employed in this case comprise the first to third and any one or more of the fourth to sixth, or the fourth to sixth and any one or more of the first to third, of the following:

| | | | | | | | | |
|---|---|---|---|---|---|---|---|---|
| (s = 0) | 1 | 0 | 1 | 0 | 1 | 0 | 1 | 0; |
| (s = 1) | 1 | 1 | 0 | 0 | 1 | 1 | 0 | 0; |
| (s = 2) | 1 | 1 | 1 | 1 | 0 | 0 | 0 | 0; |
| (s = 0) | 0 | 1 | 0 | 1 | 0 | 1 | 0 | 1; |

-continued

| | | | | | | | | |
|---|---|---|---|---|---|---|---|---|
| (s = 1) | 0 | 0 | 1 | 1 | 0 | 0 | 1 | 1; and |
| (s = 2) | 0 | 0 | 0 | 0 | 1 | 1 | 1 | 1. |

Since there will be only four, five or six (as opposed to 256) test words, the total test time in the above example of a 512K RAM will be reduced (by a factor of 4, 5 or 6 to 256) from approaching eleven minutes to about 10 to 15 seconds, resulting in the total test time coming into acceptable limits at least in many cases.

The method of the invention is applicable in various different testing environments. It can, for example be used to test data lines of a RAM included in a circuit each time that power is applied to the circuit. That is, the method can form (or form part of) a diagnostic check procedure performed each time that the circuit is powered up. As shown in FIG. 3, such a procedure may, for instance, be employed in the case of a microprocessor circuit, in which case the microprocessor could generate the test words and perform the writing, reading and checking steps. The method of the invention also can be used to test data lines of a RAM including in a circuit after or during manufacture of the circuit. Further, as shown in FIG. 4, the method can be used to perform "on-wafer" testing of semiconductor RAMs, that is to test data lines of a RAM which is one of a plurality of RAMs on a semiconductor wafer destined to be divided into chips for forming integrated circuits. Arrangements for testing of RAMs on a semiconductor wafer are well known in the art.

The above and other objects, features and advantages of the invention will be apparent from the following description of illustrative embodiments, which is to be read in conjunction with the accompanying drawings.

BRIEF DESCRIPTION OF THE DRAWINGS

FIG. 3 is a schematic view of a typical RAM included in a circuit for performing RAM testing in accordance with the present invention; and FIG. 4 is a block diagram of a plurality of RAMs on a semiconductor wafer.

DESCRIPTION OF THE PREFERRED EMBODIMENTS

Figure 1:
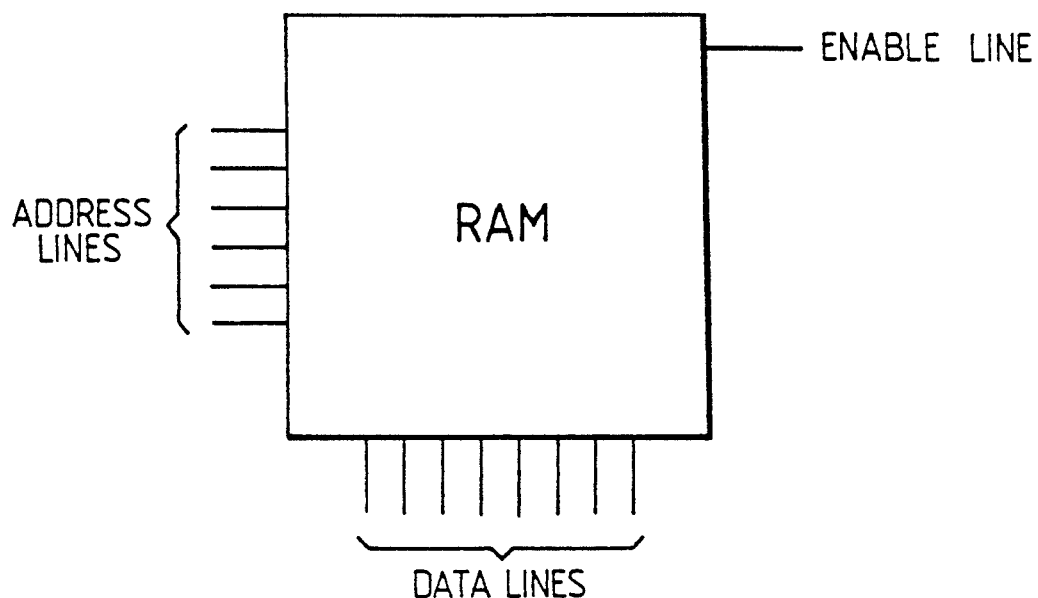
FIG. 1 is a schematic view of a typical RAM.

To define the test words to be used for testing the data lines of a RAM by a method embodying the invention, the number D of data lines (or, in other words, the data bus width), which is equal to the capacity or bit length of each address location of the RAM, must first be determined. For most popular RAMs, D will be an integral power of 2, that is $D = 2^n$.

Then, two sets (Set 1 and Set 2) of test words can be defined as follows.

Set 1

1.1) The least significant $2^s$ bits are set to binary level 0.

1.2) The next $2^s$ bits of (ascending nomenclature or ascending order of significance) are set to the binary level which is opposite or inverse to that of the previous $2^s$ bits, that is to binary level 1.

1.3) Step 1.2 is then repeated as necessary until all D bits have been set or determined.

Set 2

2.1) The least significant $2^s$ bits are set to binary level 1.

2.2) The next $2^s$ bits (of ascending nomenclature or ascending order of significance) are set to the binary level which is opposite or inverse to that of the previous $2^s$ bits, that is to binary level 0.

2.3) Step 2.2 is the repeated as necessary until all D bits have been set or determined.

In any case where the number of data lines D is not an integral power of 2, that is where the equation $D = 2^n$ would not result in an integral value of n, n is redefined as being the next largest integer to the original value of n. In other words, the relationship $2^n = >D > 2^{n-1}$ is adopted. Since this would result in the number of bits in each test word being greater than D, the test words are truncated to limit the number of bits in each test word to D. This would usually involve truncating the test words at either end, that is removing or deleting (not using) one or more of the most significant bits or one or more of the least significant bits to leave only the D least significant bits or the D most significant bits (that is, removing X surplus most significant or least significant bits, where $X = 2^n - D$), though it is possible that deletion of other bits would result in the test words being capable, as described below, of determining the existence of most common kinds of fault. (This would have to be determined by checking that the truncated test words would serve to carry out their testing functions as described below). Probably, it would be necessary that the deleted bits of the different test words be of the same significance.

The above-described operation of determining or selecting the test words to be employed in an embodiment of the invention can be summarised as follows.

Set 1 comprises, for each value of s from 0 to (n−1), where D is the number of data lines and $2^n = >D > 2^{n-1}$, a first test word which (subject to truncation if necessary to limit the number of bits in the word to D) comprises groups of $2^s$ bits, wherein the bits of each group are of the same binary level and the binary level alternates between groups.

Set 2 comprises, for each value of s from 0 to (n−1), a second test word which is the same as the first test word for the same value of s except that the corresponding bits of the two words are of opposite binary level.

The test words established as described above are used to test a RAM as follows. Any one of the test words is written into all of the address locations of the RAM. The test word is then read from each of the address locations and each test word as so read out is compared with the test word as written in to check whether it is the same. That writing, reading and checking operation is then repeated with the other test words (in any order). If none of the checking operations performed when each of the test words is read out of each of the address locations indicates a disparity between the written in and read out test word, it can be concluded that the RAM is free from at least the faults mentioned below.

The generation of the test words and control of their being written to and read from the RAM and checked against the test word as written into and the RAM can be performed by hardware or software. Generally, and in particular when the testing of the RAM is performed as (or as part of) a diagnostic check conducted when a microprocessor circuit of which the RAM forms part (see FIG. 3) is powered up, it will be convenient for the above tasks to be performed by a suitably programmed microprocessor, for example by extra software included in the program of the microprocessor of the microprocessor circuit.

Figure 2:
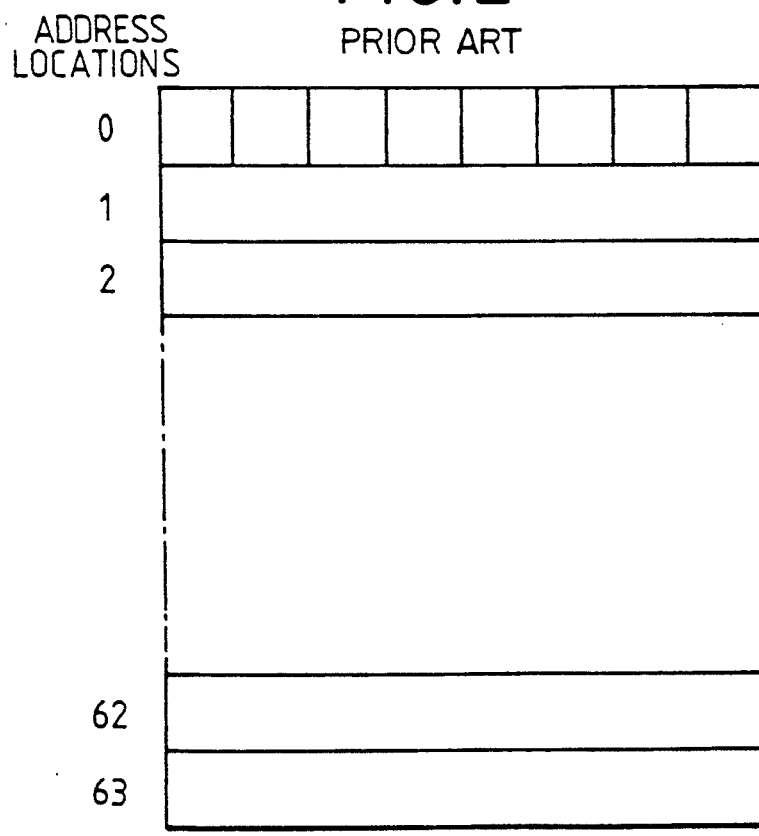
FIG. 2 is a memory map of a typical RAM.

In order to give a specific example of the test words, the test words produced in the case of a RAM having eight data lines (that is having a data bus width of eight bits) as described above with reference to FIGS. 1 and 2, whereby $n=3$ (since $D=8$), are given in the table that appears below. Each number in the first row of the table after the legend "Bit" represents the significance of the bit of each test word appearing below it, with Bit 0 being the least significant bit, and also serves to identify the data line of the RAM to which the relevant bit is applied.

TABLE

| Test Word | Bit: | | | | | | | |
|---|---|---|---|---|---|---|---|---|
| | 7 | 6 | 5 | 4 | 3 | 2 | 1 | 0 |
| (Set 1: s = 0) | 1 | 0 | 1 | 0 | 1 | 0 | 1 | 0 |
| (Set 1: s = 1) | 1 | 1 | 0 | 0 | 1 | 1 | 0 | 0 |
| (Set 1: s = 2) | 1 | 1 | 1 | 1 | 0 | 0 | 0 | 0 |
| (Set 2: s = 0) | 0 | 1 | 0 | 1 | 0 | 1 | 0 | 1 |
| (Set 2: s = 1) | 0 | 0 | 1 | 1 | 0 | 0 | 1 | 1 |
| (Set 2: s = 2) | 0 | 0 | 0 | 0 | 1 | 1 | 1 | 1 |

An explanation will now be given of how the test words employed in methods in accordance with the invention enable commonly occurring faults to be detected. The explanation refers, by way of example, to the exemplary test words set out in the above table for the case in which $D=8$.

Each of the three pairs of test words comprising the words from Sets 1 and 2 with the same value of s mutually check for the following three errors on the data lines:

1. Any data line being open circuit.
2. Any data line being short circuited to be the supply voltage or ground.
3. Any data line being short circuited to an address line.

Thus, taking for example the case of the pair of test words comprising those from Sets 1 and 2 for which $s=0$: one or the other of the two test words will be in error when read from the RAM if any of the data lines is open circuited, since the relevant bit of one of the two test words will be of the wrong binary level; one or the other of the two test words will be in error when read from the RAM if any of the data lines is short circuited to the supply voltage or ground, since the relevant bit of one of the two test words will be clamped at binary level 0 or 1 by the short circuit; and one or the other of the two test words will be in error when read from the RAM if any of the data lines is short circuited to an address line, since such a short circuit will mimic a short circuit to either binary level 0 or 1 in that the address line will be at either of these levels.

If it were required to check only if the three types of error listed at 1 to 3 above, it would be necessary to employ only two test words, namely one each from Sets 1 and 2 with the same value of s. However, all of the test words set out above are employed in an embodiment of the invention since use of these enables checking for another commonly occurring type of error, namely a short circuit between any two or more of the data lines. Such an error is looked for, as will now be explained, by the three test words of each of Sets 1 and 2.

Consider, for example, the three test words of Set 1. Referring to the above table, it will be seen that the test word of Set 1 in which $s=0$ will check for a short circuit between the data line for Bit 0 and those for Bits 1, 3, 5 and 7 in that a short circuit will result in the test word, when read out, being in error in that Bit 0 will not differ from Bit 1, 3, 5 or 7.

In similar manner, the test word of Set 1 in which $s=1$ will check for a short circuit between the data line for Bit 0 and those for Bits 2, 3, 6 and 7 and the test word of Set 1 in which $s=2$ will check for a short circuit between the data line for Bit 0 and those for Bits 4, 5, 6 and 7. That is, the three test words of Set 1 (and also the three test words of Set 2) will, between them, check for a short circuit between the data line for Bit 0 and all of the other data lines, that is the data lines for Bits 1 to 7.

As explained above, detection of the faults or errors set forth above requires the use of one each of the test words from Sets 1 and 2 with the same value of s and all of the test words from either Set 1 or Set 2. It should therefore be appreciated that satisfactory results should be obtainable if, instead of using both a first and a second test word for each value of s, use is made of a first test word for each value of s and a second test word for less than all (but at least one) of the values of s. Thus, in the case of the example set out in the above table, it would be sufficient to use the first to third and any one or more of the fourth to sixth, or the fourth to sixth and any one or more of the first to third, of the test words listed in the table. All but the minimum number of test words (a first test word for all values of s and a second test word for one value only of s) are redundant, though the use of more than the minimum number, for example all of the words from both sets, can provide double checking of some of the testing operations without (at least in some cases) unduly prolonging the total testing time. If simplification of test word generation and/or minimisation of total testing time is of particular importance, then only the minimum number of test words will be employed.

Although illustrative embodiments of the invention have been described in detail herein reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method for testing data lines of a random access memory having a plurality of address locations from which said data lines extend, comprising the steps of:
   generating first and second sets of test words in which each of said test words has a number of bits equal to a number (D) of said data lines, said bits in each of said test words being arranged differently from said bits in the other test words, said first set having a number (n) of said test words therein respectively identified by a designation S from 0 to $n-1$, with n being determined from the expression $2^n \geq D > 2^{n-1}$, the bits of each of the test words having said designations $S=0$ to $n-1$ in said first set being arranged in groups each having a number of bits equal to $2^s$, said bits in each of said groups having a similar binary level which is different from binary levels of said bits in adjacent groups of the respective test word, said second set having from one to n test words with respective designations $S=0$ to $n-1$ and which are respectively similar to said test words with the same designations in said first set except that the binary level of each of the bits of each test word in said second set is opposite to the binary level of the respective bit of the corresponding test word in said first set;

writing one of said test words from either of said first and said second sets into each of said address locations of said random access memory;

reading the test word which was written into each of said address locations from each of said address locations;

determining whether each of the read test words is the same as the test word which was written into each of said address locations;

repeating said writing, said reading and said determining steps, so that all of said test words in said first set are written and read and only one of said test words in said second set is written and read.

2. A method according to claim 1, wherein said second set has said n number of said test words.

3. A method according to claim 1, in which D=8 whereupon n=3 and in which the test words of said first set having the designations (s=0), (s=1) and (s=2) include the following bits:

| (s = 0) | 1 | 0 | 1 | 0 | 1 | 0 | 1 | 0; |
| (s = 1) | 1 | 1 | 0 | 0 | 1 | 1 | 0 | 0; |
| (s = 2) | 1 | 1 | 1 | 1 | 0 | 0 | 0 | 0; | and the test words of said second set include at least one of the following:

| (s = 0) | 0 | 1 | 0 | 1 | 0 | 1 | 0 | 1; |
| (s = 1) | 0 | 0 | 1 | 1 | 0 | 0 | 1 | 1; [and] |
| (s = 2) | 0 | 0 | 0 | 0 | 1 | 1 | 1 | 1. |

4. A method according to claim 1, in which D=8 whereupon n=3 and in which the test words of said second set include at least one of the following:

| (s = 0) | 1 | 0 | 1 | 0 | 1 | 0 | 1 | 0; |
| (s = 1) | 1 | 1 | 0 | 0 | 1 | 1 | 0 | 0; |
| (s = 2) | 1 | 1 | 1 | 1 | 0 | 0 | 0 | 0; | and the test words of said first set include the following:

| (s = 0) | 0 | 1 | 0 | 1 | 0 | 1 | 0 | 1; |
| (s = 1) | 0 | 0 | 1 | 1 | 0 | 0 | 1 | 1; [and] |
| (s = 2) | 0 | 0 | 0 | 0 | 1 | 1 | 1 | 1. |

5. A method according to claim 1, in which said random access memory is included in a circuit and in which said method is used for testing said data lines of said random access memory included in said circuit while said circuit is being manufactured.

6. A method according to claim 1, which is used for testing the respective data lines of a plurality of random access memories located on a semiconductor wafer which is to be divided into a plurality of chips for integrated circuits.

7. A method according to claim 1, in which said random access memory is included in a circuit and in which said method is used for testing said data lines of said random access memory included in said circuit after said circuit is manufactured.

8. A method according to claim 1, in which said random access memory is included in a circuit and in which said method is used for testing said data lines of said random access memory included in said circuit each time that power is applied to said circuit.

9. A method according to claim 8, wherein said circuit includes microprocessor means and said microprocessor means is used for said generating, said writing, said reading and said determining steps.

* * * * *